United States Patent
Pappas et al.

(10) Patent No.: US 10,157,573 B2
(45) Date of Patent: Dec. 18, 2018

(54) DISPLAY WITH REDUNDANT LIGHT EMITTING DEVICES

(71) Applicant: Facebook Technologies, LLC, Menlo Park, CA (US)

(72) Inventors: Ilias Pappas, Cork (IE); Sean Lord, Ottawa (CA); Yu-Hsuan Li, Hsinchu (TW)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/498,399

(22) Filed: Apr. 26, 2017

(65) Prior Publication Data
US 2017/0309224 A1    Oct. 26, 2017

(30) Foreign Application Priority Data

Apr. 26, 2016   (GB) .................................. 1607248.0
Apr. 25, 2017   (WO) ................ PCT/US2017/029418

(51) Int. Cl.
*G09G 3/3233*    (2016.01)

(52) U.S. Cl.
CPC ... *G09G 3/3233* (2013.01); *G09G 2300/0439* (2013.01); *G09G 2310/0262* (2013.01); *G09G 2320/043* (2013.01); *G09G 2330/10* (2013.01)

(58) Field of Classification Search
CPC .......................................... G09G 3/30–3/3291
See application file for complete search history.

(56) References Cited

U.S. PATENT DOCUMENTS 7,462,897 B2 * 12/2008 Endo ................... G09G 3/3233
                                                            250/553
7,545,352 B2 *  6/2009 Kwak ................. G09G 3/3233
                                                            313/500
(Continued)

FOREIGN PATENT DOCUMENTS

CN       102915703 B     12/2014
EP         1615195 A1     1/2006
WO    WO 2016/062835 A1   4/2016

OTHER PUBLICATIONS

GB Combined Search and Examination Report, GB Application No. 1607248.0, Oct. 26, 2016, 6 pages.
(Continued)

*Primary Examiner* — Patrick F Marinelli
(74) *Attorney, Agent, or Firm* — Fenwick & West LLP

(57) ABSTRACT

An active matrix display where in one embodiment each cell comprises: a driving circuit for providing current to light emitting devices placed in the cell under the control of a data driver signal, a first light emitting device location connected to the driving circuit and a second light emitting device location connected in series to the first light emitting device location. A first thin-film transistor (TFT) is connected in parallel with the first light emitting device location and a second TFT is connected in parallel with the second light emitting device location, its gate node connected to the gate node of the first TFT. One terminal of a third TFT is connected to the gate nodes of the first and second TFTs and selectively connects a control signal to the first and second TFTs under the control of a scan driver signal. The control signal determines which of a first or second light emitting device placed in the cell emits light when the driving circuit provides current.

13 Claims, 6 Drawing Sheets

(56) References Cited

U.S. PATENT DOCUMENTS

| | | | |
|---|---|---|---|
| 7,760,165 B2* | 7/2010 | Cok | G09G 3/3233 345/76 |
| 7,808,460 B2* | 10/2010 | Nakajima | G09G 3/14 345/82 |
| 7,893,610 B2* | 2/2011 | Lee | H01L 27/3246 313/503 |
| 8,426,227 B1 | 4/2013 | Bibl et al. | |
| 9,099,665 B2* | 8/2015 | Suganuma | H01L 51/50 |
| 9,570,532 B2* | 2/2017 | Huangfu | G09G 3/3225 |
| 9,754,538 B2* | 9/2017 | Lee | G09G 3/3291 |
| 2003/0011377 A1 | 1/2003 | Oohata et al. | |
| 2005/0231459 A1 | 10/2005 | Furukawa | |
| 2006/0022909 A1* | 2/2006 | Kwak | G09G 3/3233 345/76 |
| 2006/0197722 A1* | 9/2006 | Nakajima | G09G 3/14 345/83 |
| 2008/0074356 A1* | 3/2008 | Cok | G09G 3/3233 345/76 |
| 2009/0066617 A1* | 3/2009 | Chang | G09G 3/3233 345/83 |
| 2010/0134018 A1 | 6/2010 | Tziony et al. | |
| 2013/0201321 A1 | 8/2013 | Chao et al. | |
| 2014/0167011 A1* | 6/2014 | Huangfu | G09G 3/3225 257/40 |
| 2014/0267683 A1 | 9/2014 | Bibl et al. | |
| 2014/0354286 A1 | 12/2014 | Kim | |
| 2015/0054542 A1 | 2/2015 | Song | |
| 2015/0371585 A1 | 12/2015 | Bower et al. | |
| 2016/0005383 A1* | 1/2016 | Lee | G09G 3/3291 345/690 |
| 2016/0351092 A1* | 12/2016 | Chen | G09G 3/3233 |
| 2017/0047393 A1 | 2/2017 | Bower et al. | |
| 2017/0301296 A1* | 10/2017 | Pappas | G09G 3/3266 |
| 2017/0309224 A1* | 10/2017 | Pappas | G09G 3/3233 |
| 2017/0372677 A1* | 12/2017 | Chang | G09G 3/3233 |

OTHER PUBLICATIONS

GB Further Search Report Under Section 17, GB Application No. 1607248.0, Feb. 7, 2018, 1 page.

PCT International Search Report and Written Opinion, PCT Application No. PCT/GB2016/052722, dated Dec. 16, 2016, 12 pages.

PCT International Search Report and Written Opinion, PCT Application No. PCT/US2017/029418, dated Jul. 24, 2017, 14 pages.

* cited by examiner

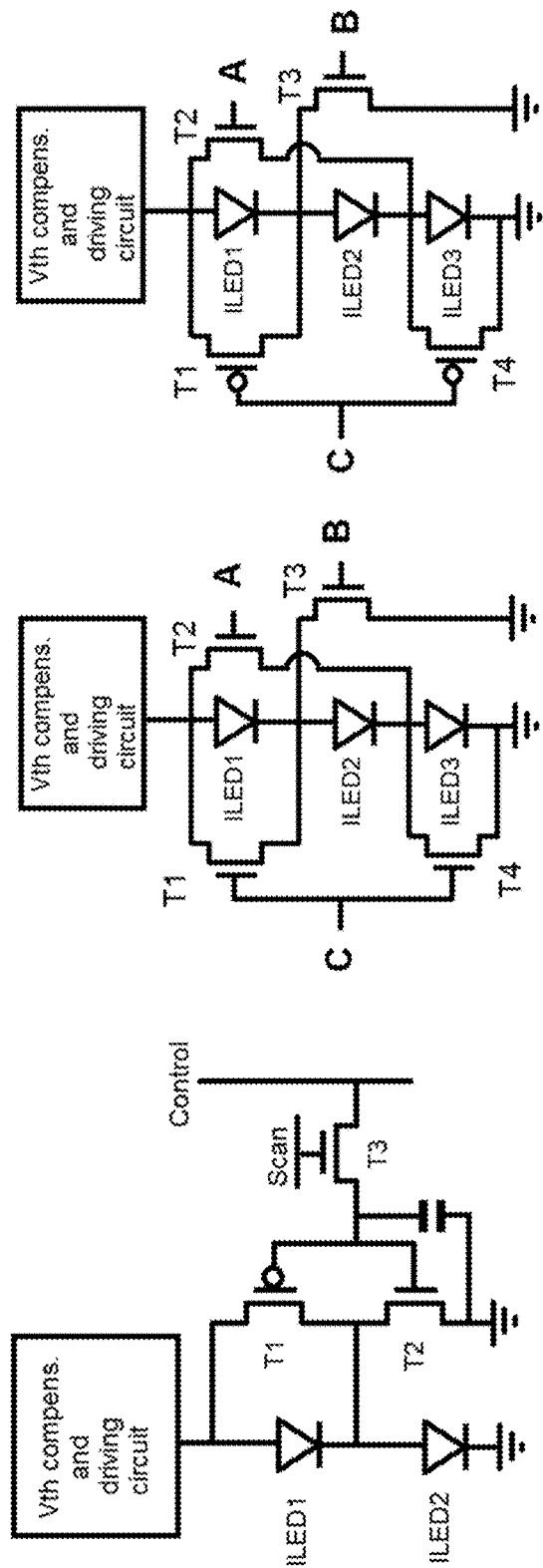

DISPLAY WITH REDUNDANT LIGHT EMITTING DEVICES

CROSS REFERENCE TO RELATED APPLICATIONS

This application claims the priority of PCT Application No. PCT/US17/29418, filed Apr. 25, 2017 and United Kingdom Application No. 1607248.0, filed Apr. 26, 2016, which is incorporated by reference in its entirety.

FIELD

The present invention relates to a display and a method of driving a display.

BACKGROUND

Displays are ubiquitous and are a core component of every wearable device, smart phone, tablet, laptop, desktop, TV or display system. Common display technologies today range from Liquid Crystal Displays (LCDs) to more recent Organic Light Emitting Diode (OLED) displays.

Referring now to FIG. 1, there are shown an active drive matrix for a display. The matrix comprises N rows of cells divided into M columns. Each cell includes a light emitting device corresponding to either: a pixel for a monochrome display; or one of a red, green or blue sub-pixel within a color display. For color displays either: differently colored sub-pixels can be interleaved along rows of the matrix; or respective rows of the matrix can comprise only sub-pixels of a given colour.

A plurality of peripheral driving blocks comprise:

Scan driver—which produces pulsed signals S1 . . . Sn enabling respective rows of the matrix to be programmed for a subsequent frame or sub-frame; and Data driver—which delivers data outputs D1 . . . Dm to program individual cells of a row enabled by the scan driver—these signals are updated for each frame or sub-frame from scan line to scan line.

In some matrices, a constant supply voltage (Vdd) is provided to each cell of the matrix to drive the light emitting device during a frame according to the cell programming. Typically, for a constant supply voltage (Vdd) implementation, the data driver provides analog outputs which determine the brightness of a cell for a subsequent frame.

In the matrix of FIG. 1, a PWM (Pulse Width Modulation) Driver produces PWM pulses used to bias programmed cells enabling the cells to emit light or not during a sub-frame according to their programming. (Note that the term "PWM" is used in the present description to relate to pulsed signals for activating cells within a row—such pulses may be employed as part of a conventional PWM addressing scheme, such as described in WO2010/014991 or a color sequential scheme, such as described in WO2014/012247.) For PWM, the data driver typically provides digital outputs with the PWM driver providing variable width pulses which in combination with the cell programming for a sub-frame determines the brightness of a cell for a frame.

UK Patent Application No. 1604699.7 (Ref: I35-1702-01 GB) filed 21 Mar. 2016 discloses a hybrid scheme where the data driver provides combinations of analog or digital outputs limiting the switching frequency required of the PWM driver; while UK Patent Application No. 1606517.9 (Ref: I35-1702-02 GB) filed 14 Apr. 2016 discloses a cell for an active drive matrix providing voltage threshold compensation.

In FIG. 1, two synchronization blocks are employed: one located between the scan driver and data driver in order to ensure that the required data signals are delivered after a scan pulse is applied to a row; and a second between the data and PWM drivers to ensure that PWM pulses are applied when data loading is completed.

Each row within the matrix is addressed with a respective scan line S1 . . . Sn which goes high or is asserted when a respective row of the display is to be addressed (or programmed) by the data driver for the subsequent frame or sub-frame. For PWM, during a given frame, for each row, the PWM driver provides a sequence of driving pulses using respective PWM signals P1 . . . Pn. Each signal P can be a time shifted version of the adjacent PWM signal synchronized with the scan line signals S1 . . . Sn and data driver signals D1 . . . Dm.

Active matrix circuitry, for example, as described in WO2010/119113, uses thin film transistor technology (TFT), where cells comprise transistors based on amorphous, oxide or polycrystalline silicon technology manufactured on a glass substrate ranging in size from 30 cm×40 cm to the latest generation (known as GEN10) of 2.88 m×3.15 m. The TFTs are used either as voltage switches or current sources to control the operation of light emitting devices within each cell.

In most portable, typically battery powered, devices, the display uses the majority of the available power. The most common user complaint for portable devices is insufficient display brightness. To extend battery life and improve brightness levels it is necessary to develop new display technologies that reduce power consumption and produce higher luminance emission from the light source.

WO2013/121051 discloses an improved light emitting device for a display, referred to as an integrated or inorganic LED (iLED) which comprises a substrate with a semiconductor material comprising a light generating layer positioned on the substrate. The semiconductor material and/or the substrate are configured to control light internally to output quasi-collimated light from a light emitting surface of the iLED. The iLED comprises an optical component positioned at the light emitting surface and configured to receive quasi-collimated light exiting the light emitting surface and to alter one or more optical properties of at least some of the quasi-collimated light.

Whereas OLED cells operate by passing current through organic or polymer materials sandwiched between two glass planes to produce light; iLED displays replace the OLED material with discrete LED die (which is made of inorganic materials) placed at each cell of the display.

Standard (i.e. inorganic) LED devices have been around for many years and their performance (efficiency, brightness, reliability and lifetime) has been optimized over that time as the LED industry has pursued many commercial opportunities—especially the challenge of developing LED technology to enable it to replace the standard incandescent bulbs for general light applications, i.e. inorganic LEDs are significantly more efficient, bright and reliable than the new and less developed OLED materials.

The concept of individually switchable standard LED dies (R, G & B) at each pixel in a display is also known. This approach is in widespread use for large information displays. However, to-date it has not been possible to scale this approach down to smaller displays, as standard LEDs are typically planar in design and so are inefficient in controlling the direction of emitted light. Additionally, the assembly of the many millions of pixels needed for a laptop or smart phone display is not feasible using standard assembly/manufacturing techniques.

SUMMARY

According to a first aspect there is provided a display according to claim 1.

This aspect can provide redundancy for displays comprising discrete light emitting devices which have a high but not perfect degree of reliability. For example, after initial pick-and-place of devices such as iLEDs within a matrix, it is expected that their yield will be more than 90% but less than 99% i.e. up to 10% of devices might be defective. Nonetheless, employing the present display enables only a minority of light emitting device to be tested and known good to produce displays with the highest level of yield.

The cell design for the display avoids the need for laser opening or shorting connections to defective devices with a display.

In some embodiments, placed light emitting devices are controlled automatically so that only one device per cell operates.

In alternative embodiments, at least two devices are placed within each cell and these are selectively operated so that the display can switch between operating modes, for example, wide-angle and narrow-angle display.

In a second aspect, there is provided a display.

In this aspect, a shared driving circuit reduces the substrate area required for a pixel leading to a higher pixel density. This contrasts with active drive matrices where each pixel is divided into three sub-pixels, each one representing one color (Red, Green, and Blue), with each requiring a driving circuit to produce the necessary bias current.

According to this aspect, all light emitting devices are biased with the same current, meaning that no more than one driving circuit per pixel is needed. Colors are produced directly from the pixel by controlling which light emitting devices emit light and for how long.

BRIEF DESCRIPTION OF THE DRAWINGS

Embodiments of the invention will now be described, by way of example, with reference to the accompanying drawings, in which:

FIG. 3 shows a cell design for an active matrix display according to an embodiment of the present invention;

FIG. 4 shows a cell design with three light emitting devices connected in series and controlled by n-type TFTs according to another embodiment of the present invention;

FIG. 5 shows a cell design with three light emitting devices connected in series and controlled by CMOS TFTs according to a further embodiment of the present invention;

DESCRIPTION OF THE EMBODIMENTS

Figure 2:
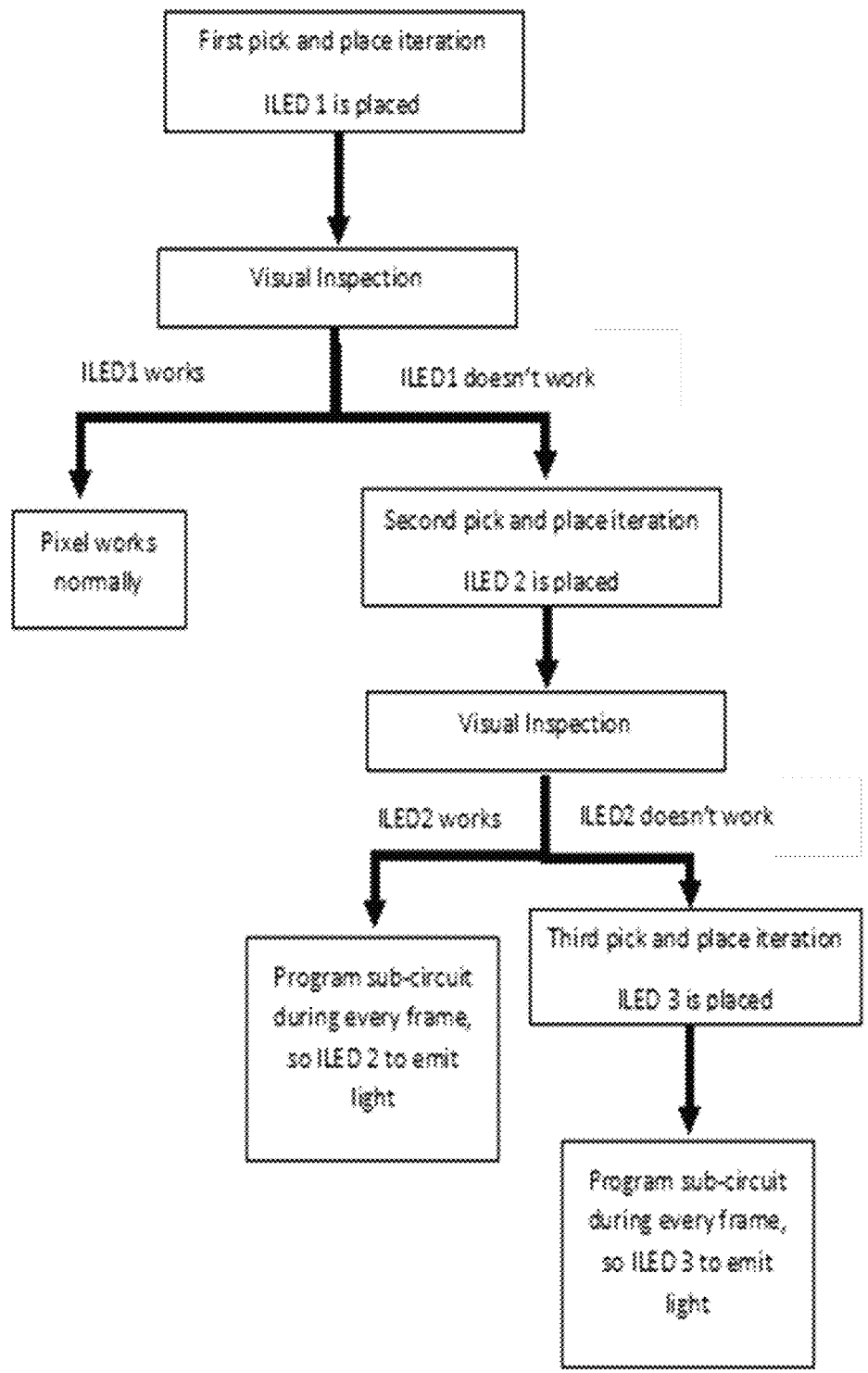
FIG. 2 shows a placement method for light emitting devices within a display according to an embodiment of the present invention.

Referring now to FIG. 2, when light emitting devices such as the iLEDs referred to above are initially placed on a substrate, their yield is expected to be between 90-95% which is lower than the acceptable yield for a high performance display. This means that cells containing these devices need to be repaired if the display is to be shipped. One method for doing so comprises placing a second light emitting device in a cell containing a defective first device and then using laser to open or melt fuses to disconnect the first device from the cell driving circuit to which the second device is connected. The same procedure could be used if a third or fourth device were to be placed on the cell. As will be appreciated this "physical" solution has limited applicability (5-10 pixels per display), requires special equipment and increases the process time.

In order to overcome these problems, embodiments of the present invention provide a cell comprising a plurality of locations in which light emitting devices can be placed. Examples of cell design will be described later, but we would first of all begin by describing a placement method for a display based on a cell design capable of receiving three light emitting devices.

Initially, discrete light emitting devices such as iLEDs referred to above are placed in respective first locations of all cells of the display panel—this is typically performed using a pick-and-place technique where light emitting devices can be placed either in series or in parallel. When the pick-and-place is complete, the panel is tested through a visual inspection. Cells including devices that don't operate are recognized. The locations of these defective cells can be stored in a memory element available to the matrix controller (not shown) and in this way, a map of defective cells within the display can be produced. This panel map can be used later for programming the display.

A second pick-and-place round now places devices in second locations of cells previously identified as containing defective devices. The second pick-and-place round can employ known good light emitting devices and it will be seen that where the natural yield of these devices is high, then only a small minority of such devices need to be tested in order that they would be known to be good. Nonetheless, especially where each cell includes locations for more than two devices, this testing may not be necessary.

After the second pick-and-place, another visual inspection occurs. For any second placed device identified as working properly, the programming of the pixel can remain as before so that the second placed device can work according to the panel map. If any second placed device is identified as not working, a third light emitting device can be placed in the cell. Again, these device may be known good devices and again it will be seen that if only these devices were to be tested, only an extremely small number of such tests would need to be performed. The location of the second placed devices that don't work can again be stored in memory in a second panel map which can be used for programming the display.

As will be appreciated, this process can be repeated for as many devices as any potentially defective cell may be able to accommodate. Depending on the reliability of devices being placed, placement of two, three or more device could be necessary in order to achieve acceptable yield.

It can be understood, that as the number of devices which a cell might be able to accommodate is increased, more complex circuitry will be require to control them. A maximum number of locations is determined by the TFT process, the available pixel area and the light emitting device manufacture and assembly method.

Turning now to examples of cell design which can be employed in displays being populated according to the method of FIG. 2.

FIG. 3 shows a cell design which can be employed within an active drive matrix and where locations for up to two placed light emitting devices, in this case ILED1 and ILED2, are connected in series. The control circuit comprises 3 TFTs T1 . . . T3 and a charge storage capacitance. A data driver signal, such as D1 . . . Dm in FIG. 1 for the cell is provided by a data driver to the cell through an otherwise conventional voltage threshold compensation and driving circuit. Alternatively, a voltage threshold compensation and driving circuit such as disclosed in UK Patent Application No. 1606517.9 (Ref: I35-1702-02 GB) filed 14 Apr. 2016 can be employed. By comparison to a conventional 2T1C cell design, an additional control signal is needed and it is asserted (or not) in accordance with the value in the panel map for the display. Indeed the control signal state is essentially permanent as long as the value for the cell in the panel map does not change.

Figure 1:
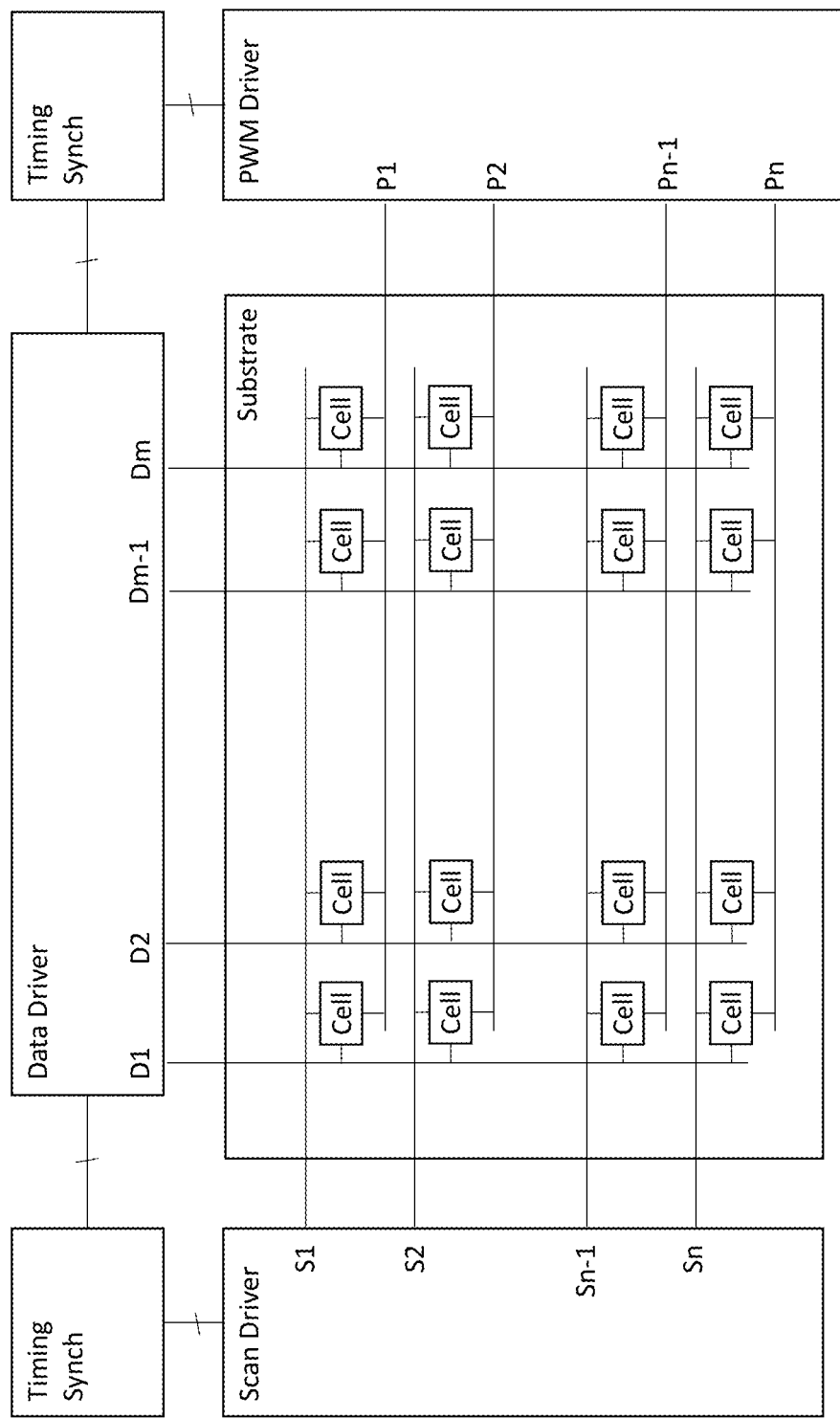
FIG. 1 shows a conventional type active matrix display.

If ILED1 has been checked as working normally, during the frame programming period when the scan driver signal, such as S1 . . . Sn in FIG. 1, is asserted, the control signal of the sub-pixel will have high "1" value, so turning ON T2 and connecting ILED1 to ground so that it will emit light in accordance with the data driver signal.

Where ILED2 has been placed, because ILED1 has been identified as defective, the control signal will have low "0" value meaning that T2 will be turned OFF and T1 ON, so ILED1 will be shorted and ILED2 to be connected directly to the driving circuit. Therefore, ILED1 will not emit light and only ILED 2 will do so. The truth table for this situation is shown in Table 1.

TABLE 1

Truth Table for two ILEDs connected in series configuration

| Control | ILED |
|---------|------|
| 0 | ILED2 |
| 1 | ILED1 |

In variants of the cell design of FIG. 3, a discrete storage capacitor may not be necessary, particularly for a display with a high refresh rate and where the voltage at the gates of T1 and T2 would remain stable enough without the need of the capacitance. In some implementations, a data driver signal (not shown) provided through the driving circuit might be asserted for a complete frame. In this case, the Scan signal could have the same timing as the data driver signal and again the capacitance would not be needed.

As indicated above, if the desired yield can't be achieved with a cell design capable of locating two light emitting devices, a third one can be located. For the three devices, the complexity of the cell design is increased.

Nonetheless, different configurations are possible depending on the TFT process being employed, for example, if only n-type TFTs are available (amorphous silicon TFTs and indium-Gallium-Zinc-Oxide—IGZO TFTs), or only p-type TFTs are available (Low Temperature polycrystalline Silicon—LTPS) or if CMOS devices are available (LTPS).

Referring now to FIG. 4, there is shown a cell design implemented with n-type TFTs T1 . . . T4 only, whereas the cell design of FIG. 5 is implemented with CMOS TFTs T1 . . . T4. A configuration with only p-type TFTs would be the same as in FIG. 4, with all n-type TFTs being replaced with p-type TFTs.

In both of these cases, either a constant supply voltage Vdd is provided through the driving circuit, or the driving circuit is switched using a PWM type pulsed signal.

As it can be seen from FIGS. 4 and 5, three control signals (A, B and C) are required as well as additional circuitry to deliver these control signals. Thus instead of a single bit data line as for the cell design of FIG. 3, this might comprise 3 bits. However, when implementing a redundancy scheme for the display, the relative values of these 3 bits would remain constant through the life of the display, with each 3 bit combination being specific to a cell in accordance with the panel map values for the cell.

In each of FIGS. 4 and 5 when a defective light emitting device is placed, it will be shorted by a corresponding TFT and at the same time a following functioning iLED should be connected to ground so it can emit light. Thus, when ILED1 should emit light, it is connected to ground through T3, while when it is not to emit light, it is shorted by T1. For each configuration of TFT process, a truth table exists which illustrates the way that the additional circuitry has to be programmed, so that a corresponding ILED will emit light. The truth tables for each case are shown below.

TABLE 2

Truth Table for FIG. 4 implemented with only n-type TFTs.

| A | B | C | ILED |
|---|---|---|------|
| 0 | 0 | 0 | All |
| 0 | 0 | 1 | ILED2 |
| 0 | 1 | 0 | ILED1 |
| 0 | 1 | 1 | None (Repair) |
| 1 | 0 | 0 | ILED3 |
| 1 | 0 | 1 | None (Repair) |
| 1 | 1 | 0 | ILED3 |
| 1 | 1 | 1 | None (Repair) |

TABLE 3

Truth Table for FIG. 4 implemented with only p-type TFTs.

| A | B | C | ILED |
|---|---|---|------|
| 0 | 0 | 0 | None (Repair) |
| 0 | 0 | 1 | ILED3 |
| 0 | 1 | 0 | None (Repair) |
| 0 | 1 | 1 | ILED3 |
| 1 | 0 | 0 | None (Repair) |
| 1 | 0 | 1 | ILED1 |
| 1 | 1 | 0 | ILED2 |
| 1 | 1 | 1 | All |

TABLE 4

Truth Table for FIG. 5 implemented with CMOS TFTs.

| A | B | C | ILED |
|---|---|---|------|
| 0 | 0 | 0 | ILED2 |
| 0 | 0 | 1 | All |

TABLE 4-continued

Truth Table for FIG. 5
implemented with
CMOS TFTs.

| A | B | C | ILED |
|---|---|---|---|
| 0 | 1 | 0 | None (Repair) |
| 0 | 1 | 1 | ILED3 |
| 1 | 0 | 0 | None (Repair) |
| 1 | 0 | 1 | ILED1 |
| 1 | 1 | 0 | None (Repair) |
| 1 | 1 | 1 | ILED1 |

As it is be seen from the truth tables, there are states where "All" emitting devices can be biased in order to emit light. Although there may be applications where this could be useful, it will be appreciated that applications which involve attempting to drive all placed devices could cause a cell potentially containing a malfunctioning device to be driven in an uncontrolled manner.

There are also states where no devices will emit, since all of them are shorted by the TFTs, and this can be used as a repair method. Thus, if the third (or last) ILED which is placed doesn't work properly, it is preferable to treat the pixel comprising the cell as a "black" pixel and not to emit light, rather than driving the cell in an uncontrolled manner. Thus, in this case, the TFTs for a pixel are programmed in such way that all devices of the pixel are shorted to ensure that they will not emit light.

In the circuits a FIGS. 4 and 5, a scan driver signal is not shown, however, it will be appreciated that each of control signals A, B and C can be connected to the gates of TFTs T1 ... T4 via respective further TFTs (not shown) controlled by a scan driver signal as in the circuit of FIG. 3.

The configurations of FIGS. 3-5 have light emitting devices connected in series to a common driving circuit and voltage threshold compensation circuit.

Figure 6:
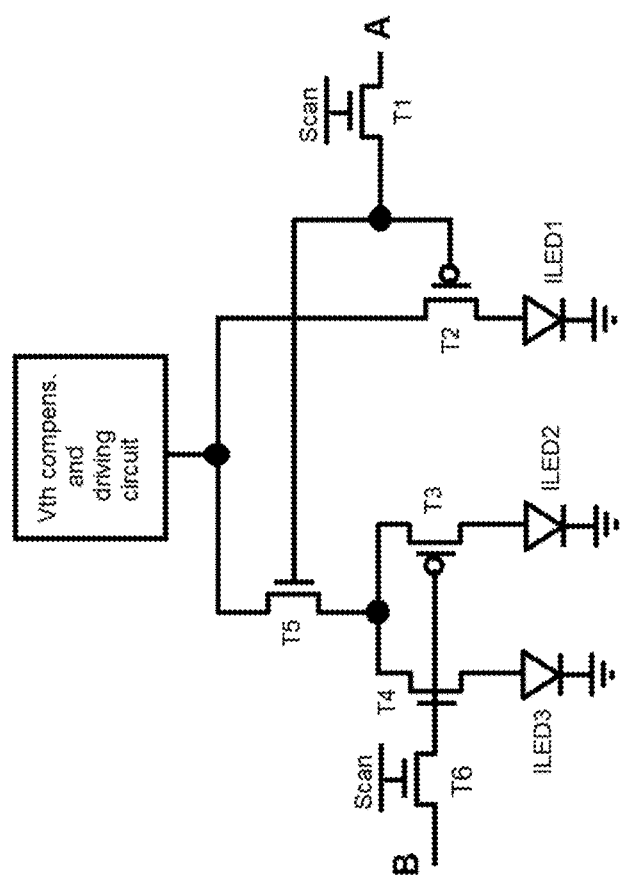
FIG. 6 shows a cell design with three light emitting devices connected in parallel according to a still further embodiment of the present invention.

FIG. 6 shows a cell design where three ILEDs are connected in parallel. The circuit of FIG. 6 can be implemented with a CMOS TFT process, as it requires oppositely doped TFTs. In FIG. 6, if only ILED1 is placed, control signal A has low "0" value resulting in T2 being turned ON. ILED1 is directly connected to the driving circuit so it emits light. When control signal A has high "1" value, T2 is turned ON and ILED1 is shorted and then control signal B will determine which from ILED2 or ILED3 will emit light. If control signal B has low value "0", ILED2 will emit light and if control signal B has high "1" value, ILED3 will illuminate. The corresponding truth table is shown below.

TABLE 5

Truth Table for
FIG. 6 implemented
with CMOS TFTs.

| A | B | ILED |
|---|---|---|
| 0 | X | ILED1 |
| 1 | 0 | ILED2 |
| 1 | 1 | ILED3 |

X: either "1" or "0"

One issue with the parallel configuration of FIG. 6, is the varying number of TFTs lying between the driving circuit and the selected light emitting device, especially the number of intermediate TFTs when ILED3 should emit light. This implies that the power supply voltage has to be increased to ensure that all TFTs operate in saturation region and the voltage at the ILED anode is more than its threshold voltage. Also, with the ILEDs connected in parallel and only the control signals A, B, C, one ILED will always emit light, meaning that no "Repair" configuration exists as in the implementations of FIGS. 4 and 5.

In general in the above described examples, it is desirable to drive only a selected one light emitting device within a cell during operation of the display.

However, there are applications where it can be useful to place more than one light emitting device within a cell and to selectively drive these.

One such application provides a display with dynamic viewing angle. According to this application, one ILED with narrow and another ILED with wide beam are picked-and-placed within respective locations in every cell of the display (or at least those whose mode is to be changed). Depending on the required display mode, the corresponding ILED will be biased as explained above. For example, if only one user is viewing the display, the narrow beam (narrow viewing angle) devices would operate and if two or more users are viewing the display, the wide beam (wide viewing angle) would be used. (This technique could of course be extended to cover three different types of light emitting device being placed within each cell and being selected according to the required display mode.)

In multi-display mode case, the value of the control signal or the relative values of signals A, B, C, rather than being permanent through the life of the display in accordance with the panel map, is switched dynamically according to the required display mode for the display. Also, rather than providing a per cell control signal or signals A, B, C, the control or A, B, C signals would be global, applying to the whole matrix. In a multi-display mode case where redundancy is not provided, there would be no need for a panel map.

Swapping between modes can either be user driven; or can be automatic in response to viewing conditions (for example, if the display controller detects the number of people viewing the display).

In a still further application, again two or more different sets of light emitting devices can be placed and these can be selectively driven to provide a display which can selectively operate in one of a 2D display mode and a 3D display mode.

Figure 7:
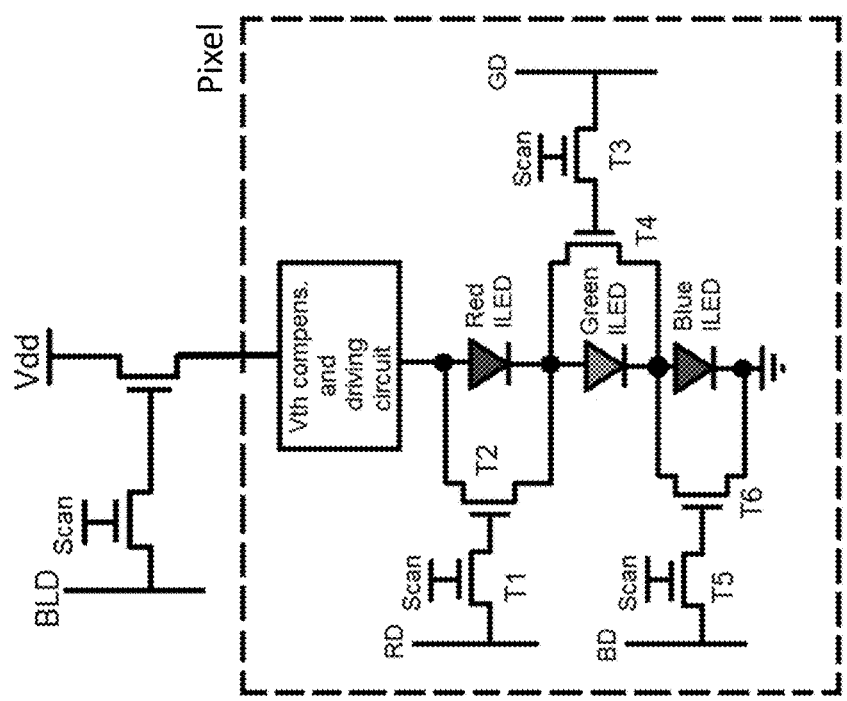
FIG. 7 shows a pixel design with three differently colored light emitting devices connected in series according to an embodiment of the present invention.

Referring now to FIG. 7, discrete light emitting devices, such as iLEDs, of differing colors behave differently than OLEDs in that there is a similar limited current range where the efficiency of red, green and blue discrete light emitting devices can be high and similar.

In the cell design of FIG. 7, not only are light emitting devices of the same color or type connected in series, but light emitting devices for sub-pixels of a cell are connected in series and driven from a common voltage threshold compensation and driving circuit. Since the red, green and blue light emitting devices are connected in series, only one driving circuit is needed, meaning that the area efficiency of the pixel on the substrate is increased so enabling high display resolution.

In FIG. 7 three identical circuits, each comprising two TFTs are applied to each ILED. One TFT (T2, T4 and T6) is connected in parallel to each ILED and a second TFT (T1, T3 and T5) is connected to the individual control signal Red Data (RD), Green Data (GD) and Blue Data (BD). During frame programming, a Scan driver pulse goes high "1" and T1, T3 and T5 are turned ON. Whether RGB ILEDs are to be turned ON or OFF is determined by the value of RD, BD, GD. If RD is high "1", T2 will be turned ON and Red ILED will be shorted resulting in not emitting light. On the other hand, if RD is low "0", T2 will remain OFF, so the Red ILED will be biased with the current produced by the driving circuit and it will emit light. The same procedure also occurs for Green ILED (T4 with GD) and Blue ILED (T6 and BD).

In the circuit of FIG. 7, the ILEDS could be turned OFF, by asserting RD, BD and GD during a frame programming period. However, this would mean that power would be drawn through the transistors T2, T4 and T6 during this time. Thus, in the circuit of FIG. 7 an additional control signal Black data (BLD) controls power to the driving circuit. When BLD is asserted, no power flows through the pixel. The switching frequency of the BLD control line would typically be much less compared to the other data lines RD, BD, GD because this will only be activated for completely black pixels. Furthermore, using BLD improves the contrast ratio for a pixel because in this way, all current is blocked, resulting in a much deeper black colour.

As will be appreciated, not all of the iLEDs of FIG. 7 should emit light contemporaneously or to the same extent, in order to produce the required grey-scale and color gamut for a frame. Ideally, the control signals driving the cell would be digital to ensure that each iLED would operate when switched on at its optimal operating current.

Thus, displays incorporating the pixel design of FIG. 7 are either driven using a Pulse-Width Modulation (PWM) or color sequential scheme of the type referenced above.

In this case, instead of a constant Vdd, PWM signals are provided from a PWM driver such as shown in FIG. 1. BLD, RD, GD and BD control signals are asserted in accordance with the required state of a pixel for a given sub-frame, each sub-frame varying in length. In both cases, if 8-bits grey-scale is desired, the frame time is divided into 8 sub-frames, each one having different duration. The Most significant Bit (MSB) of the grey-scale will have the longest pulse while the Least Significant Bit (LSB) will have the narrowest pulse. The difference between PWM and color sequence is that in the case of the PWM, all ILEDs emit light simultaneously during one sub-frame while for the color sequence each sub-frame is further divided into Red, Green and Blue periods meaning that for a given sub-frame duration only Red ILEDs over the whole panel emit light, then only Green ILEDs and finally only Blue ILEDs.

The difference results in the colour sequential scheme requiring at least three times higher switching frequency since during the same sub-frame, it has to switch three times, once for each colour. Both driving schemes suffer from different visual artefacts that can be solved using special driving algorithms. In any case, the most important criterion for both schemes is that their frequency to be high enough, so that ILED ON/OFF transition is not noticeable by the human eye.

In the circuit of FIG. 7, a maximum frequency can be achieved due to the lack of storage capacitance on all data paths; whereas in other designs a storage capacitance can be connected at the gate node of the driving TFT in order to keep the gate voltage constant during a sub-frame duration.

In FIG. 7, the control signals determine if the parallel connected TFTs are ON or OFF. This means that their gate voltage may vary during the frame duration as long as it ensures that the TFT is turned ON. The lack of storage capacitance also reduces the data column power consumption which is among the highest in a display.

On the other hand, if storage capacitance is provided for each sub-pixel and a data driver capable of providing analog or digital outputs were employed, then the hybrid driving scheme described in UK Patent Application No. 1604699.7 (Ref: I35-1702-01 GB) filed 21 Mar. 2016 could be used to limit the switching frequency required of the PWM driver.

Finally, it will be appreciated that when a semiconductor light emitting device, such as an iLED emits light, there is a voltage drop between its terminals, referred to as threshold voltage. Where light emitting devices are connected in series, the total voltage difference between the output of the driving circuit and the ground should be at least the sum of their threshold voltages, for example, in FIG. 7 the threshold voltages for the red, green and blue ILEDS. This means that the high supply voltage (Vdd) (or pulsed PWM signal voltage) will be higher by comparison to circuits driving only one light emitting device in order to ensure all devices can emit light. Nonetheless, even though the supply voltage Vdd will be increased in FIG. 7, the total power consumption will be kept the same since the total ILEDs bias current is ⅓ of that for circuits driving only one light emitting device due to current sharing between the light emitting devices.

Figure 8:
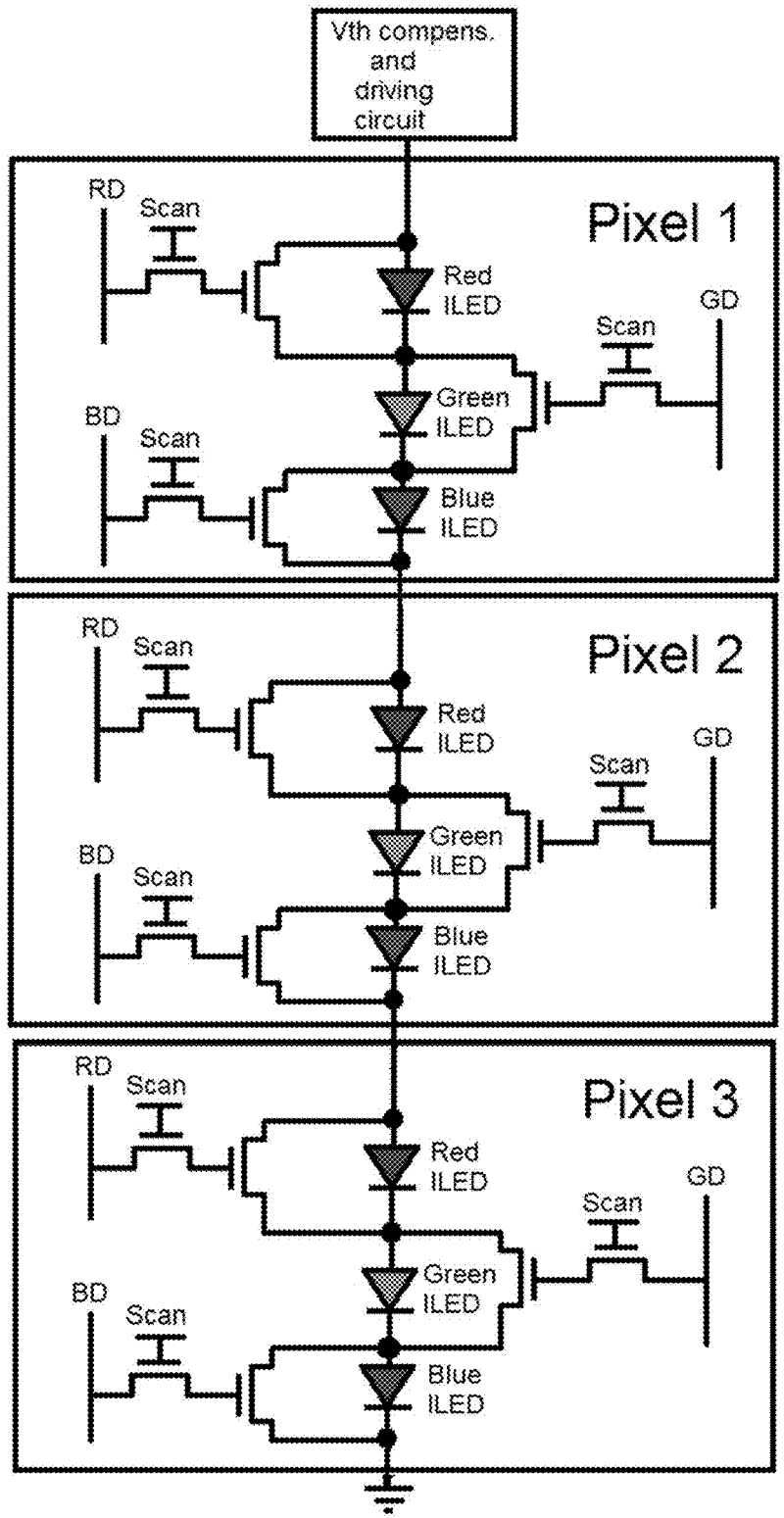
FIG. 8 shows three pixels such as shown in FIG. 7 connected in series according to a still further embodiment of the present invention.

Referring now to FIG. 8, in some applications, in which sufficiently high supply voltages are available, more than one pixel can share the driving circuit. Since the driving conditions of all ILEDs are the same, the driving circuit that produces the necessary bias current can be shared between more than one pixel. The only limitation for the number of the pixels that can share the driving circuit is how high the supply voltage is. The condition that has to be satisfied is:

$$Vdd > \Delta V_{driving,circuit} + \sum_{i=0}^{n} Vth_i$$

where $\Delta V_{driving,circuit}$ is the voltage drop over the driving circuit while producing the necessary $\sum_{i=0}^{n} Vth_i$, $Vth_i$ is the combined threshold voltage of the light emitting devices within a pixel i existing on the driving circuit to ground path and n is the maximum number of pixels.

As mentioned above, the voltage threshold and driving circuit illustrated in FIGS. 3-8 can be any suitable design which produces an accurate bias current with immunity to TFT threshold voltage variations. Furthermore, the driving circuit can be either dynamic meaning that it can be programmed during every frame or sub-frame or DC (only programmed once) or even programmed periodically with a frequency much lower than the frame rate (FR). In the case of the DC or periodically programmed cases, any existing current source can be used if it can be implemented in the available pixel area.

In the matrix of FIG. 1, the data driver is shown as a singular unit, however, it will be appreciated that in embodiments of the present invention the functionality of the data driver (and indeed the other peripheral components) can be divided among more than one unit, for example, with one unit providing data signals and another providing control signals.

The features of the above described embodiments can be used either in combination or individually within a given display. In each case, embodiments are suitable for either wearable displays, such as smartwatches or large panel displays.

What is claimed is:

1. A display comprising:
   a matrix comprising a plurality of N rows divided into a plurality of M columns of cells, each cell being arranged to receive up to at least two light emitting devices;

a scan driver providing a plurality of N scan line signals to respective rows of the matrix, each for selecting a respective row of the matrix to be programmed with pixel values; and a data driver providing a plurality of M variable level data signals to respective columns of the matrix, each for programming a respective pixel within a selected row of the matrix with a pixel value;

wherein each cell further comprises:

a driving circuit for providing current to light emitting devices placed in the cell under the control of a data driver signal, a first light emitting device location connected to the driving circuit, a first thin-film transistor (TFT) connected in parallel with the first light emitting device location, a second light emitting device location connected in series to the first light emitting device location, a second TFT connected in parallel with the second light emitting device location, its gate node connected to the gate node of the first TFT, and a third TFT with one terminal connected to the gate nodes of the first and second TFTs and selectively connecting a control signal to the first and second TFTs under the control of a scan driver signal, the control signal determining which of a first or second light emitting device placed in the cell emit light when the driving circuit provides current; and wherein the second light emitting device is only in the second light emitting device location when the first light emitting device in the first light emitting device location is defective.

2. The display according to claim 1, wherein each cell further comprises a capacitance connected to the gate nodes of the first and second TFTs.

3. The display according to claim 1, wherein each of the first and second TFTs are oppositely doped.

4. The display according to claim 1, further including a memory storing first light emitting device locations within the matrix containing defective light emitting devices, the data driver being arranged to provide control signals of opposite polarity for the locations compared to cells with first light emitting device locations containing operating light emitting devices.

5. The display according to claim 1, wherein light emitting devices of a first type are placed in first light emitting device locations throughout the matrix, light emitting devices of a second type are placed in second light emitting device locations throughout the matrix.

6. The display according to claim 5, wherein the control signal is common to the matrix, the common control signal value being chosen to drive either light emitting devices in the first light emitting device locations or the second light emitting device locations throughout the matrix.

7. A display comprising:

a matrix comprising a plurality of N rows divided into a plurality of M columns of cells, each cell being arranged to receive up to at least two light emitting devices;

a scan driver providing a plurality of N scan line signals to respective rows of the matrix, each for selecting a respective row of the matrix to be programmed with pixel values; and a data driver providing a plurality of M variable level data signals to respective columns of the matrix, each for programming a respective pixel within a selected row of the matrix with a pixel value;

wherein at least one cell of the plurality of cells further comprises:

a driving circuit for providing current to light emitting devices placed in the cell under the control of a data driver signal, a first light emitting device directly connected to the driving circuit, a first thin-film transistor (TFT) directly connected in parallel with the first light emitting device, a second light emitting device directly connected in series to the first light emitting device, a second TFT directly connected in parallel with the second light emitting device, its gate node directly connected to the gate node of the first TFT, and a third TFT with one terminal directly connected to the gate nodes of the first and second TFTs and selectively connecting a control signal to the first and second TFTs under the control of a scan driver signal, the control signal determining which of a first or second light emitting device placed in the cell emit light when the driving circuit provides current.

8. The display according to claim 7, wherein the at least one cell further comprises a capacitance connected to the gate nodes of the first and second TFTs.

9. The display according to claim 7, wherein each of the first and second TFTs are oppositely doped.

10. The display according to claim 7, wherein the first light emitting device is defective.

11. The display according to claim 7, further including a memory storing first light emitting device locations within the matrix containing defective light emitting devices, the data driver being arranged to provide control signals of opposite polarity for the locations compared to cells with first light emitting device locations containing operating light emitting devices.

12. The display according to claim 7, wherein light emitting devices of a first type including the first light emitting device are in first light emitting device locations throughout the matrix, light emitting devices of a second type including the second light emitting device are in second light emitting device locations throughout the matrix.

13. The display according to claim 12, wherein the control signal is common to the matrix, the common control signal value being chosen to drive either light emitting devices in the first light emitting device locations or the second light emitting device locations throughout the matrix.

* * * * *

UNITED STATES PATENT AND TRADEMARK OFFICE
CERTIFICATE OF CORRECTION

PATENT NO. : 10,157,573 B2
APPLICATION NO. : 15/498399
DATED : December 18, 2018
INVENTOR(S) : Pappas et al.

Page 1 of 1

It is certified that error appears in the above-identified patent and that said Letters Patent is hereby corrected as shown below:

In the Claims

In Column no: 11, Line(s) no: 27, Claim 1, "cell emit light" to read as --cell emits light--

In Column no: 12, Line(s) no: 30, Claim 7, "cell emit light" to read as --cell emits light--

Signed and Sealed this
Thirtieth Day of July, 2019

Andrei Iancu
*Director of the United States Patent and Trademark Office*